(12) United States Patent
Ferri

(10) Patent No.: US 7,830,289 B2
(45) Date of Patent: Nov. 9, 2010

(54) SIGMA-DELTA MODULATOR FOR PWM APPLICATIONS WITH MINIMUM DYNAMICAL CONTROL AND DITHERING

(75) Inventor: Simone Ferri, Pogliano Milanese (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 85 days.

(21) Appl. No.: 12/247,330

(22) Filed: Oct. 8, 2008

(65) Prior Publication Data
US 2009/0096649 A1 Apr. 16, 2009

(30) Foreign Application Priority Data
Oct. 10, 2007 (IT) .......................... VA2007A0076

(51) Int. Cl.
*H03M 3/00* (2006.01)

(52) U.S. Cl. ....................... 341/143; 341/155; 341/169; 341/170

(58) Field of Classification Search ................. 341/143, 341/155, 169, 170
See application file for complete search history.

(56) References Cited

U.S. PATENT DOCUMENTS

| | | | | |
|---|---|---|---|---|
| 5,815,102 A * | 9/1998 | Melanson | ................ | 341/143 |
| 6,140,952 A * | 10/2000 | Gaboury | ................ | 341/143 |
| 6,373,417 B1 * | 4/2002 | Melanson | ................ | 341/143 |
| 6,414,614 B1 * | 7/2002 | Melanson | ................ | 341/143 |
| 7,205,917 B2 * | 4/2007 | Magrath | ................ | 341/143 |
| 7,327,296 B1 * | 2/2008 | Gaboriau et al. | ................ | 341/143 |
| 7,532,141 B2 * | 5/2009 | Kitahira et al. | ................ | 341/152 |
| 7,570,693 B2 * | 8/2009 | Mallinson et al. | ................ | 375/254 |
| 7,626,519 B2 * | 12/2009 | Risbo | ................ | 341/53 |
| 2004/0046680 A1 * | 3/2004 | Masuda et al. | ................ | 341/143 |
| 2006/0077084 A1 * | 4/2006 | Hsu | ................ | 341/143 |
| 2006/0232457 A1 * | 10/2006 | Kishida | ................ | 341/143 |
| 2007/0176815 A1 * | 8/2007 | Kost | ................ | 341/155 |
| 2007/0188364 A1 * | 8/2007 | Fette | ................ | 341/155 |
| 2008/0272946 A1 * | 11/2008 | Melanson | ................ | 341/143 |

* cited by examiner

*Primary Examiner*—Linh V Nguyen
(74) *Attorney, Agent, or Firm*—Lisa K. Jorgenson; Allen, Dyer, Doppelt, Milbrath & Gilchrist, P. A.

(57) ABSTRACT

The circuit includes, upstream from a PWM quantizer, that is between the output of the sigma-delta modulator and the input of the PWM or PWM-like quantizer, a second or ancillary sigma-delta stage of any order and architecture, with the function of controlling the minimum dynamic of the sigma-delta modulator. This second sigma-delta stage is input with the output signal of the sigma-delta modulator summed to a signal corresponding to the difference between the input signal and the output signal of the second sigma-delta stage, delayed by a delay block.

12 Claims, 5 Drawing Sheets

INPUT SINUSOID AT 10KHz, -80dB

INPUT SINUSOID AT 10KHz, -90dB

SIGMA-DELTA MODULATOR FOR PWM APPLICATIONS WITH MINIMUM DYNAMICAL CONTROL AND DITHERING

FIELD OF THE INVENTION

The present disclosure relates to sigma-delta circuits with Pulse-Width-Modulation (PWM) or PWM-like modulation of the output signal.

BACKGROUND OF THE INVENTION

The sigma-delta circuit is a "building block" used in innumerable systems. Basically a sigma-delta circuit is a feedback circuit that generates an output digital replica of the difference between two analog input signals and is used in numerous functional circuits designed for specific applications. Most often sigma-delta circuits are used in signal converters from the analog domain to the digital domain and vice versa, in modulators, digital filters and other circuits.

In PWM applications and the like (commonly known as PWM or PWM-like systems), the sigma-delta stage or modulator is upstream of or is associated to a PWM or PWM-like quantizer stage, that in PWM applications substitutes the single bit or multiple bit quantizer that is used for implementing a converter (for example an ADC), and the feedback loop of the sigma-delta architecture is closed by a delay block $1/z$, suitable for introducing a delay equal to a fractional value of the period of the PWM signal, as depicted in FIG. 1.

FIG. 1 is an exemplary embodiment of a first-order sigma-delta PWM modulator with single bit output, the input signal of which is processed together with a signal proportional to the signal output by the output modulator, delayed by a time established by the delay block ($1/z$). Such a PWM modulator often drives a power stage, for example a loudspeaker of an acoustic system, a motion actuator and the like.

FIG. 2 illustrates a sigma-delta structure of a third-order sigma-delta PWM modulator with single bit output. To minimize distortion and because of electrical characteristics of the power transistors of output bridge stages, there may be constraints on the minimum pulse duration of PWM signals delivered to the load, as depicted in the diagram of FIG. 3. This may imply constraints on amplitudes of signals that may be correctly converted to PWM signals. In these conditions, when the amplitude of the signal input to the system decreases, the signal that inputs the PWM or PWM-like modulation quantizer may be so small to be correctly transferable in form of a PWM signal to the load of the system.

An approach disclosed in literature includes prolonging the duration of the pulse to be transferred by a time equal to the minimum transferable pulse and subtracting therefrom, immediately after, a quantity equal to the minimum duration of such a transferable pulse. In this way, an otherwise untransferable analog signal may be correctly transferred in PWM form. This approach is illustrated in FIG. 4. A drawback of this approach is a decrement of the efficiency of the output power stage because it is forced to switch more times than would be ideally necessary.

SUMMARY OF THE INVENTION

An approach found by the applicant to an inherent inefficiency of known systems is of introducing, upstream the PWM quantizer, that is between the output of the sigma-delta modulator and the input of the PWM or PWM-like quantizer, a second or ancillary sigma-delta stage of any order and architecture, with the function of controlling the minimum dynamic of the sigma-delta modulator. This second sigma-delta stage is input with the output signal of the sigma-delta modulator summed to a signal corresponding to the difference between the input signal and the output signal of the second sigma-delta stage, delayed by a delay block.

The second sigma-delta modulator effectively compensates the quantization error because it processes the difference between its input and a signal proportional to the output. Because of the function of the second sigma-delta stage, a real time quantization is performed when the error is larger than the resolution of the quantization stage or when the input signal is such to generate a non-null output.

In other words, the signal input to the second sigma-delta stage, that may be seen as a second sigma-delta modulator used for controlling the minimum dynamics, is the same signal that is input to the PWM or PWM-like quantizer, the feedback signal is the difference between the signal that is modified for respecting the minimum and maximum pulse width and the unmodified signal that otherwise would reach the input of the PWM or PWM-like quantizer. The PWM or PWM-like quantizer is thus driven by the output of the second sigma-stage control modulator of the minimum dynamics.

DETAILED DESCRIPTION OF THE PREFERRED EMBODIMENTS

Figure 1:
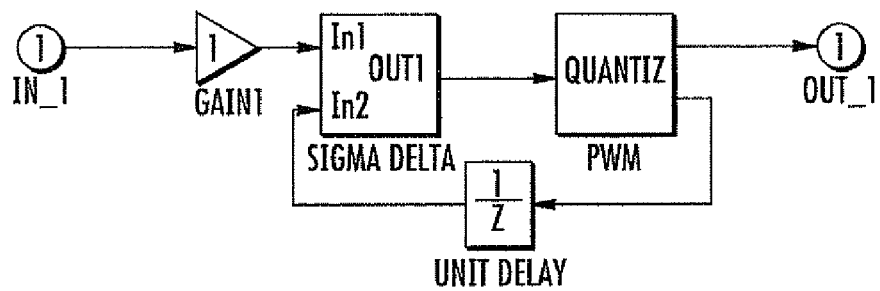
FIG. 1 is a schematic diagram illustrating a sigma-delta modulator for PWM applications according to the prior art.
Figure 3:
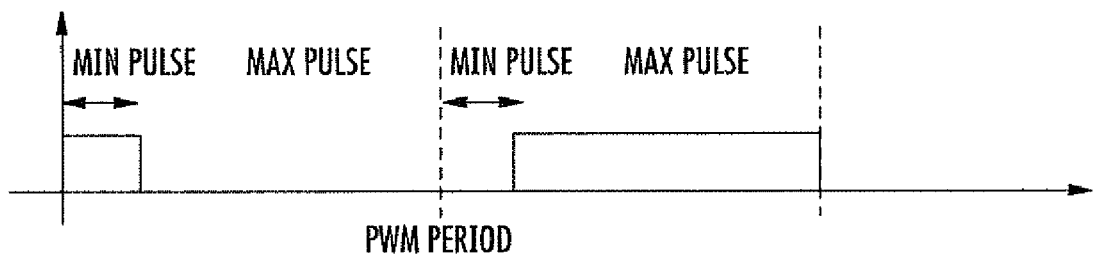
FIG. 3 is a timing diagram illustrating certain limitations of duration (width) of the pulses in a PWM system of the prior art.
Figure 2:
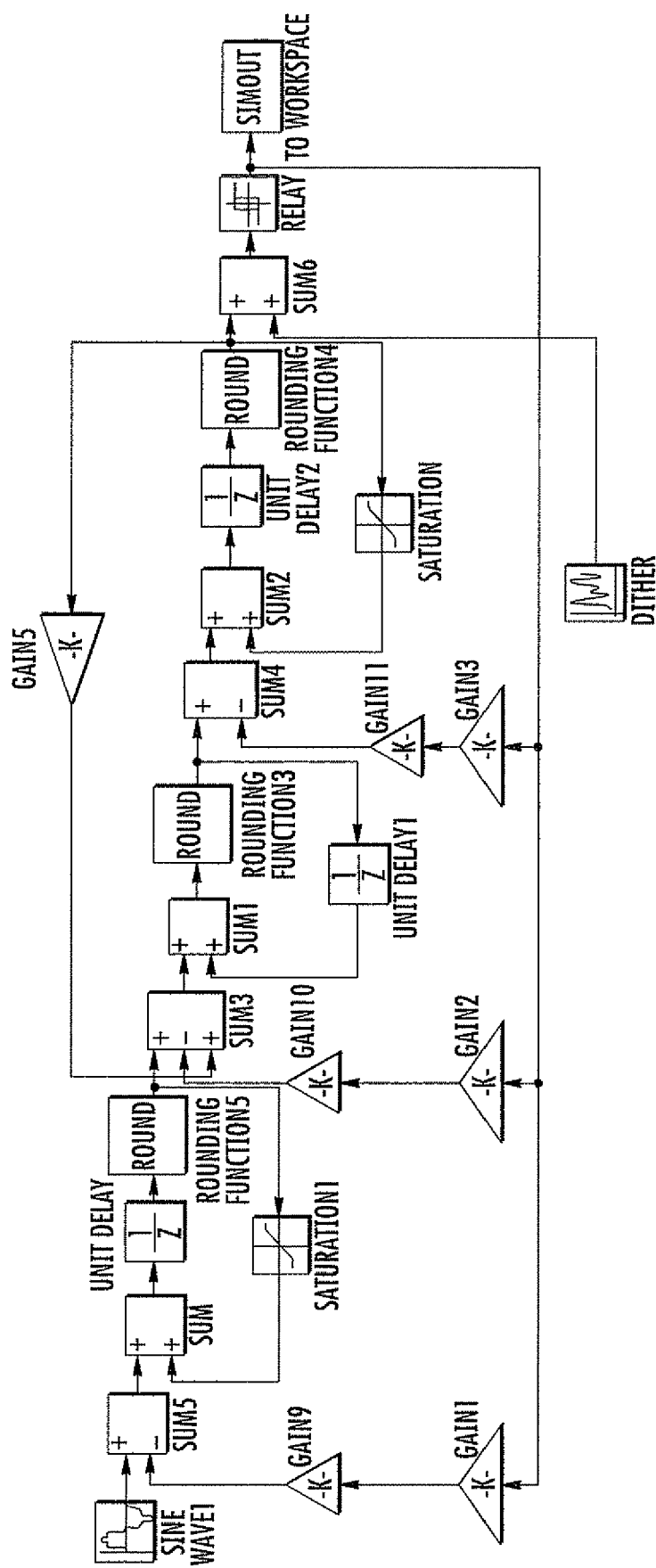
FIG. 2 is a schematic diagram illustrating a PWM sigma-delta modulator of the third order with single bit output according to the prior art.
Figure 4:
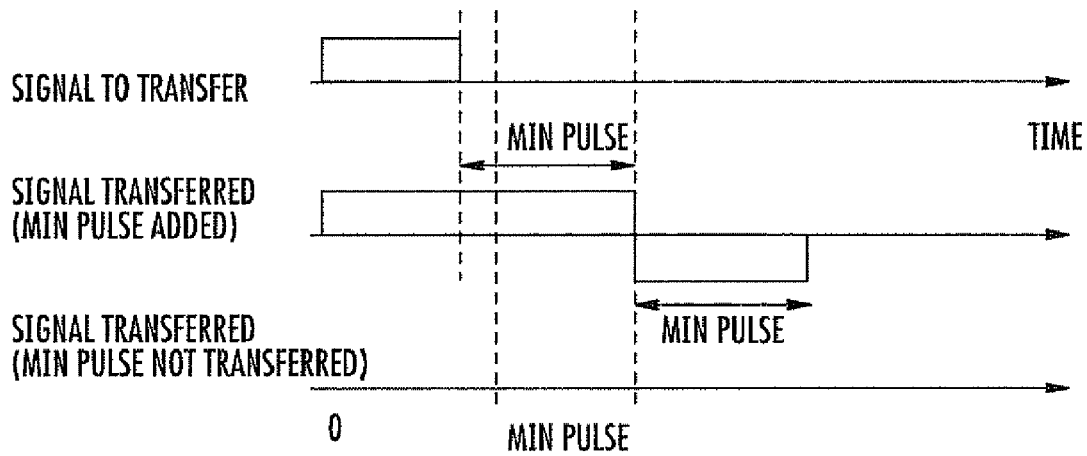
FIG. 4 is a timing diagram illustrating how limitations on the width of the pulse of a PWM system are addressed according to the prior art.
Figure 5:
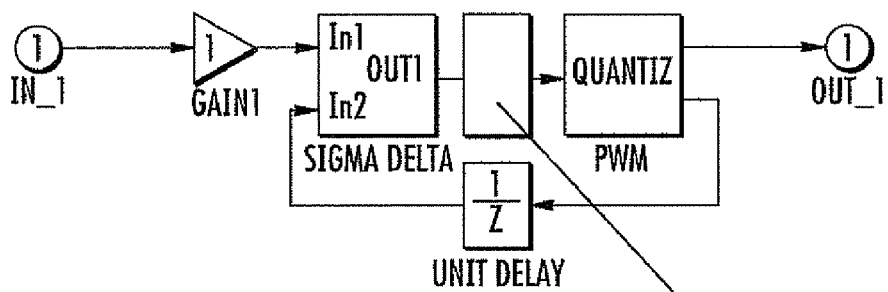
FIG. 5 is a schematic diagram illustrating an embodiment of a device in accordance with features of the present invention.
Figure 5:
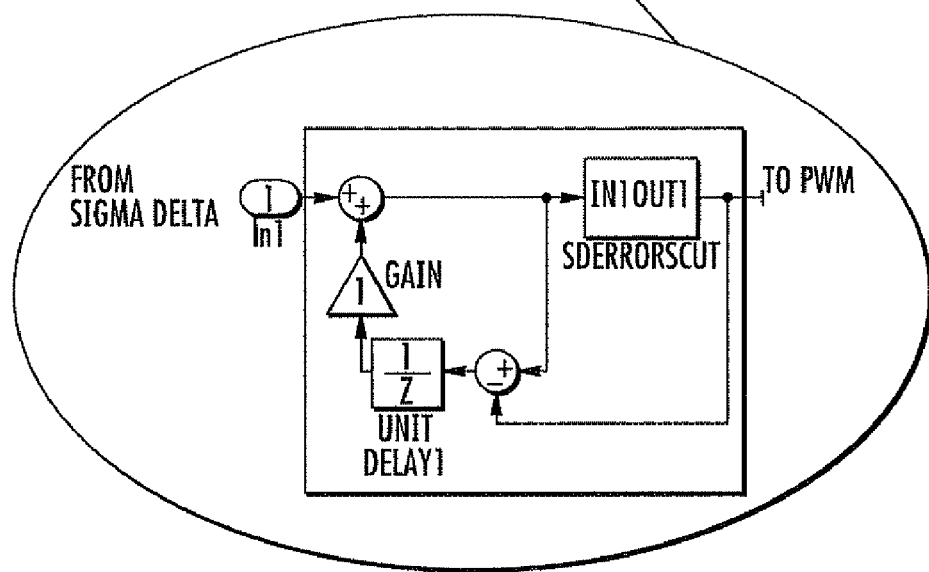

Referring to FIG. 5, the basic circuit architecture of a PWM sigma-delta modulator includes a gain stage GAIN_1, a SIGMA-DELTA circuit receiving on a first input terminal IN_1 the analog input signal, amplified by the gain stage, and on a second input terminal IN_2 a feedback signal, a PWM quantizer, input with the output signal of the SIGMA-DELTA circuit for outputting a PWM or PWM-like pulse signal with a single bit OUT_1, and a feedback signal path of the output signal of the PWN quantizer comprising a delay stage UNIT DELAY_1. The modulator further includes, according to an aspect of this disclosure, the circuit block, a detailed architecture of which is illustrated in the enlarged view of the figure, introduced in the signal path from the output of the sigma-delta circuit to the input of the PWM quantizer.

This additional circuit block contains substantially a second sigma-delta circuit SDERRORS_CUT, that is input with the output signal of the sigma-delta modulating stage of the basic architecture of the PWM modulator summed to a signal corresponding to the difference between the signal at the input terminal and at the output signal of the second sigma-delta stage, suitably delayed by a second delay block UNIT DELAY_1. The added second sigma-delta stage SDERRORS_CUT, through which the primary sigma-delta modulator SIGMA-DELTA, receiving the amplified input signal, drives the PWM or PWM-like quantizer, controls the minimum dynamics. Differently from a simple quantizer that would block the signals smaller than the minimum quantization resolution, the added sigma-delta stage SDERRORS_CUT is able to effectively compensate the error generated by the PWM quantizer.

The input dynamics of the modulator is thus significantly increased because of the lowering of the limit of the amplitude of the signal that is correctly transferred to the load. The increase of the input dynamics that is generally achieved is often larger than 20 dB. The following table resumes the results obtained with a sinusoidal input signal with a frequency of 10 kHz.

| With/without the second sigma-delta stage for controlling the minimum dynamics | Frequency of the sinusoid | Amplitude of the sinusoid | Signal/noise ratio | Amplitude of the output sinusoid |
|---|---|---|---|---|
| without | 10 KHz | −80 dB | −21.7 dB | −81 dB |
| with | 10 kHz | −80 dB | −24.6 dB | −81 dB |
| without | 10 kHz | −90 dB | No output signal | No output signal |
| with | 10 kHz | −90 dB | −13.8 | −91 dB |
| without | 10 kHz | −100 dB | No output signal | No output signal |
| with | 10 kHz | −100 dB | −5.8 dB | −101 dB |

Figure 6:
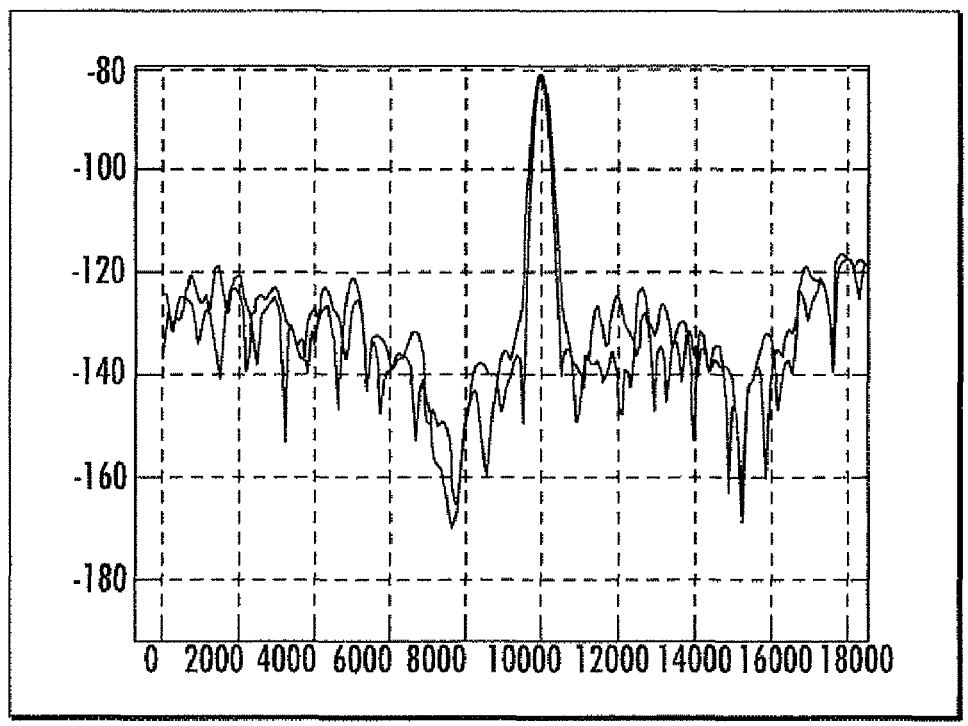
FIG. 6 is a graph depicting a frequency spectra of the output signal of a PWM sigma-delta modulator with and without the additional sigma-delta modulator for controlling the minimum dynamics in accordance with features of the present invention, for a level of the analog input signal of −80 dB.

The effectiveness of the device of this invention has been tested by applying to an input of a first-order sigma-delta modulator with single-bit PWM modulated output, a 10 kHz input sinusoid, the amplitude of which was −80 dB and recording the frequency spectrum of the output signal on the load, with and without an additional sigma-delta modulator stage for controlling the minimum dynamics. The substantial superposition of the two frequency spectra, as clearly observable in FIG. 6, demonstrates that the introduction of the second sigma-delta modulator stage for controlling the minimum dynamics does not generate any relevant distortion.

Figure 7:
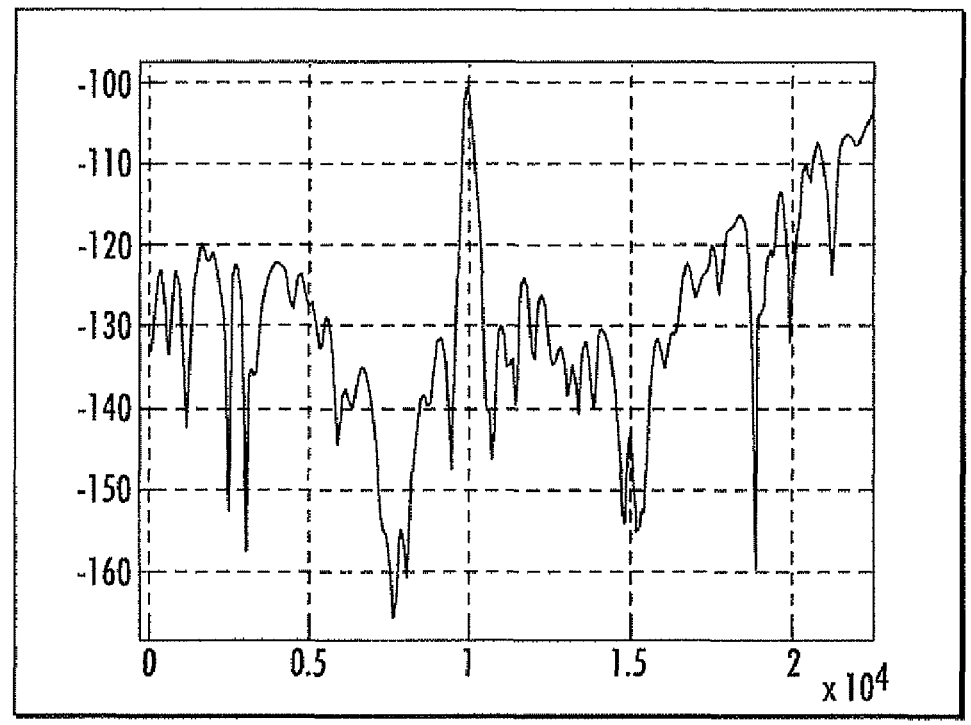
FIG. 7 depicts a frequency spectrum of the output signal of a PWM sigma-delta modulator with the additional sigma-delta modulator for controlling the minimum dynamics in accordance with features of the present invention, for an analog input signal of −90 dB, with no frequency spectrum being present without the additional sigma-delta modulator for controlling the minimum dynamics.

Moreover, when reducing the amplitude of the sinusoidal input signal down to −90 dB, without the second sigma-delta modulator of this invention for controlling the minimum input dynamics, there is no output signal. By contrast, with the introduction of a second sigma-delta modulator according to this disclosure for controlling the minimum dynamics, the input signal is still correctly transferred to the load as depicted in FIG. 7. Indeed, the frequency spectrum of the output signal is present also with an input sinusoid of such a small amplitude when the second sigma-delta modulator according to this disclosure is introduced.

For a sigma-delta modulator with PWM or PWM like output, it could be important, in case the application requires very low noise figures, to de-correlate the input signal from the PWM quantization noise of the output signal. The so-called dithering technique, that includes adding at the input of the sigma-delta circuit of the modulator a periodic signal of appropriate frequency to the analog input signal has been found to enhance performance in terms of noise figure if the dithering periodic signal is a ramp.

Moreover, it has been found that a notable improvement is obtained when the dither ramp signal that is added to the input analog signal of the sigma-delta modulator with PWM output has an amplitude of the same order of magnitude of the maximum amplitude of the analog input signal. In practice, the best signal/noise ratio and the greatest reduction of disturbing harmonics are attained by injecting a dither signal with the above characteristics.

Figure 8:
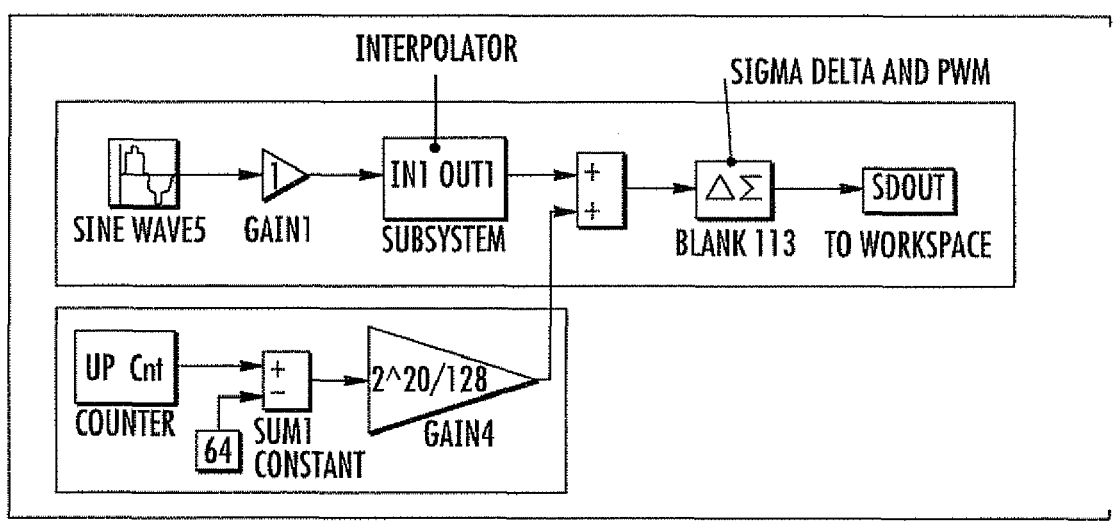
FIG. 8 is a schematic diagram illustrating a sigma-delta structure with PWM output modulating stage and a ramp dither signal generator, according to another embodiment of the present invention.

According to this other aspect of this disclosure at least to a sigma-delta circuit of a modulator that may include one or more sigma-delta circuits in cascade, exemplarily replicated inside the upper rectangular perimeter of FIG. 8, is associated a generator of a dither signal in the form of a periodic ramp, depicted inside the lower rectangular perimeter of FIG. 8. In the example illustrated in FIG. 8, the generator of the dither signal is composed of a counter, a latch in which a certain reference value (constant) is stored, an adder (Sum1) of the current value stored in the counter and of the reference value registered in the latch, and an output gain stage of the periodic ramp signal generated in function of a driving clock signal that drives the counter and of the reference value (constant) registered in the latch.

The dither generator generates a ramp signal the amplitude of which can be controlled via any automatic regulation loop commonly used for these purposes, by modifying the reference value written in the latch such to be practically equal to or almost equal to the maximum amplitude of the analog input signal to which the ramp dither signal is added at the input of the sigma-delta circuit. The frequency of the ramp signal can be kept fixed and at a value close or equal to that of the frequency of the PWM modulator or, as an alternative, it may vary randomly within a frequency range centered on the frequency of the PWM modulator, by varying the frequency of the clock signal that drives the counter.

The following table summarizes the results obtained for different amplitudes of the ramp dither signal.

| SINUSOID | | RAMP | | Output | | III | V | |
|---|---|---|---|---|---|---|---|---|
| Freq. [Hz] | Ampl. 0 to MAX | Freq. [Hz] | Ampl. 0 to MAX | SNR [dB] | Signal [dB] | harmonic [dB] | harmonic [dB] | Carrier [dB] |
| 1000 | $2^{19}$ | 1000 | 0 | 65.6 | −10.50 | −70 | −90 | −27 |
| 1000 | $2^{19}$ | 1000 | $2^{19}$ | 65.6 | −10.50 | −70 | −90 | −30 |
| 1000 | $2^{19}/2$ | 1000 | 0 | 68 | −10.60 | −82 | 101 | −30 |
| 1000 | $2^{19}/2$ | 1000 | $2^{19}$ | 69.5 | −10.50 | −82 | 104 | −32 |

-continued

| SINUSOID | | RAMP | | | | | | |
|---|---|---|---|---|---|---|---|---|
| Freq. [Hz] | Ampl. 0 to MAX | Freq. [Hz] | Ampl. 0 to MAX | SNR [dB] | Output Signal [dB] | III harmonic [dB] | V harmonic [dB] | Carrier [dB] |
| 1000 | $2^{19}/1000$ | 1000 | 0 | 13.9 | -64.30 | Same level of Noise floor | | -4.4 |
| 1000 | $2^{19}/1000$ | 1000 | $2^{19}$ | 15.3 | -64.90 | | | -4.5 |

This embodiment of the sigma-delta modulator with PWM output of this disclosure is particularly suitable for improving the performance of a class-D power amplifier of an audio playback system.

That which is claimed is:

1. A sigma-delta Pulse-Width-Modulation (PWM) modulator comprising:
    an input gain stage;
    a first sigma-delta circuit to receive on a first input an amplified analog input signal of the input gain stage and on a second input a feedback signal;
    a PWM output quantizer stage input with an output signal from the sigma-delta circuit;
    a feedback path connected between the PWM output quantizer stage and the sigma-delta circuit to provide the feedback signal, and comprising a delay network; and
    a second sigma-delta circuit, between an output of the first sigma-delta circuit and an input of the PWM output quantizer stage, and input with a sum of the output signal of the first sigma-delta circuit and a delayed signal corresponding to a difference between a signal at the input and at the output of the second sigma-delta circuit.

2. The sigma-delta PWM modulator of claim 1, further comprising a generator to add to the analog input signal that is input to the first sigma-delta circuit a periodic ramp signal having a frequency based upon a PWM quantization frequency, and having an amplitude based upon a maximum amplitude of the analog input signal.

3. The sigma-delta PWM modulator of claim 2 wherein the frequency of the periodic ramp signal comprises at least one of a frequency equal to the PWM quantization frequency and a frequency varying within a range centered on the PWM quantization frequency.

4. The sigma-delta PWM modulator of claim 2, wherein the generator comprises a counter, a reference value latch, an adder of a count value present at the output of the counter and of a reference value stored in the latch, and an output gain stage for the periodic ramp signal based upon a clock signal driving the counter and the reference value stored in the latch.

5. A sigma-delta Pulse-Width-Modulation (PWM) modulator comprising:
    an input gain stage;
    a first sigma-delta circuit to receive an input signal from the input gain stage and a feedback signal;
    a PWM output quantizer stage to receive an output signal from the sigma-delta circuit;
    a feedback path associated with the PWM output quantizer stage and the sigma-delta circuit to provide the feedback signal; and
    a second sigma-delta circuit coupled between the first sigma-delta circuit and the PWM output quantizer stage, and to receive a sum of the output signal from the first sigma-delta circuit and a delayed signal corresponding to a difference between an input signal and an output signal of the second sigma-delta circuit.

6. The sigma-delta PWM modulator of claim 5, further comprising a generator to add to the input signal that is input to the first sigma-delta circuit a periodic ramp signal having a frequency based upon a PWM quantization frequency, and having an amplitude based upon a maximum amplitude of the analog input signal.

7. The sigma-delta PWM modulator of claim 6 wherein the frequency of the periodic ramp signal comprises at least one of a frequency equal to the PWM quantization frequency and a frequency varying within a range centered on the PWM quantization frequency.

8. The sigma-delta PWM of claim 6, wherein the generator comprises a counter, a reference value latch, an adder of a count value present at the output of the counter and of a reference value stored in the latch, and an output gain stage for the periodic ramp signal based upon a clock signal driving the counter and the reference value stored in the latch.

9. A method of sigma-delta Pulse-Width-Modulation (PWM) comprising:
    providing an input signal and a feedback signal to a first sigma-delta circuit;
    providing an output signal from the sigma-delta circuit to a PWM output quantizer stage;
    providing the feedback signal via a feedback path associated with the PWM output quantizer stage and the sigma-delta circuit; and
    coupling a second sigma-delta circuit between the first sigma-delta circuit and the PWM output quantizer stage, and inputting thereto, a sum of the output signal from the first sigma-delta circuit and a delayed signal corresponding to a difference between an input signal and an output signal of the second sigma-delta circuit.

10. The method of claim 9, further comprising adding to the input signal that is input to the first sigma-delta circuit a periodic ramp signal having a frequency based upon a PWM quantization frequency, and having an amplitude based upon a maximum amplitude of the input signal.

11. The method of claim 10 wherein the frequency of the periodic ramp signal comprises at least one of a frequency equal to the PWM quantization frequency and a frequency varying within a range centered on the PWM quantization frequency.

12. The sigma-delta PWM of claim 10, wherein the periodic ramp signal is provided by a generator comprising a counter, a reference value latch, an adder of a count value present at the output of the counter and of a reference value stored in the latch, and an output gain stage for the periodic ramp signal based upon a clock signal driving the counter and the reference value stored in the latch.

* * * * *